United States Patent [19]
Löf

[11] Patent Number: 5,543,774
[45] Date of Patent: Aug. 6, 1996

[54] METHOD AND A DEVICE FOR PROTECTING A PRINTED CIRCUIT BOARD AGAINST OVERCURRENTS

[75] Inventor: C. Stefan L. Löf, Spånga, Sweden

[73] Assignee: Telefonaktiebolaget Ericsson, Stockholm, Sweden

[21] Appl. No.: 249,987

[22] Filed: May 27, 1994

[30] Foreign Application Priority Data

May 28, 1993 [SE] Sweden .................................. 9301825

[51] Int. Cl.$^6$ .......................... H01H 85/04; H01H 69/02
[52] U.S. Cl. ............................ 337/297; 337/295; 29/623
[58] Field of Search .................................. 337/186, 152, 337/159, 297, 290, 295; 29/623

[56] References Cited

U.S. PATENT DOCUMENTS

| | | | |
|---|---|---|---|
| 4,140,988 | 2/1979 | Oakes | 337/279 |
| 4,296,398 | 10/1981 | McGalliard | 337/297 |
| 4,356,627 | 11/1982 | Hoffman | 29/849 |
| 4,376,927 | 3/1983 | McGalliard | 337/297 |
| 4,379,318 | 4/1983 | Ootsuka | 361/104 |
| 4,393,432 | 7/1983 | Neuhaus | 361/104 |
| 4,394,639 | 7/1983 | McGalliard | 337/292 |
| 4,788,626 | 11/1988 | Neidig et al. | 361/715 |
| 5,027,101 | 6/1991 | Morrill | 337/297 |
| 5,254,969 | 10/1993 | Caddock | 338/308 |
| 5,296,833 | 3/1994 | Breen | 337/297 |
| 5,298,684 | 3/1994 | Leeb | 174/250 |

FOREIGN PATENT DOCUMENTS

| | | |
|---|---|---|
| 0270954 | 6/1988 | European Pat. Off. . |
| 2053881 | 5/1971 | France . |

*Primary Examiner*—Leo P. Picard
*Assistant Examiner*—Stephen T. Ryan
*Attorney, Agent, or Firm*—Burns, Doane, Swecker & Mathis, L.L.P.

[57] ABSTRACT

In order to reduce the costs of assembled printed circuit boards, a printed board fuse functions with great reliability at low manufacturing costs. By coating a large area of a printed board with metal, for example, by plating, a well-defined thickness of a metal layer may be achieved in which a fuse has been separated. The well-defined thickness also allows well-defined geometry of the fuse cross-sectional area and fuse length to be achieved and therefore its resistance and interruption characteristics will also be very accurately defined. In case of a temperature rise, the metal layer surrounding the fuse will have a heat dissipating effect on the fuse, providing a substantially reduced risk of board fire.

5 Claims, 2 Drawing Sheets

Fig. 2A
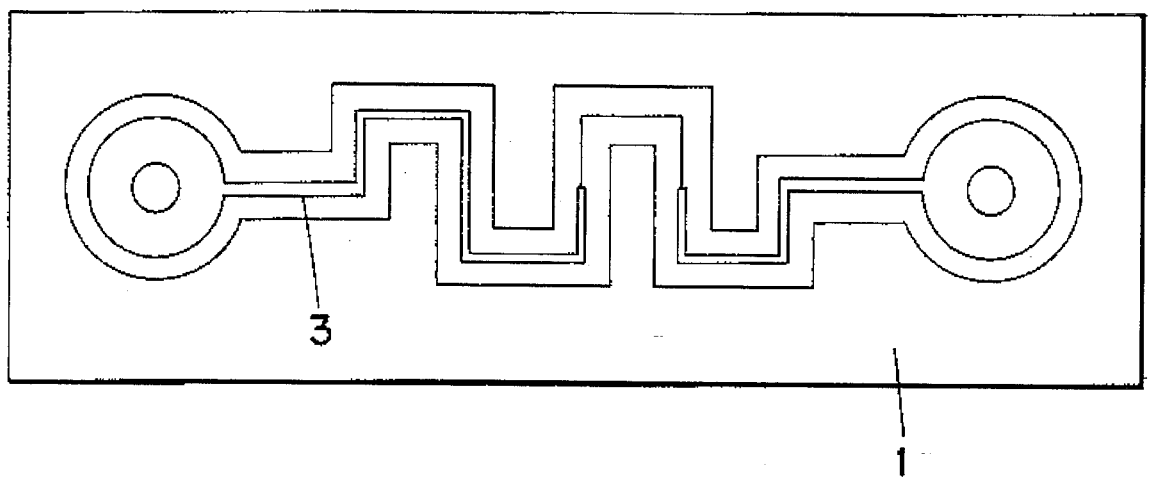
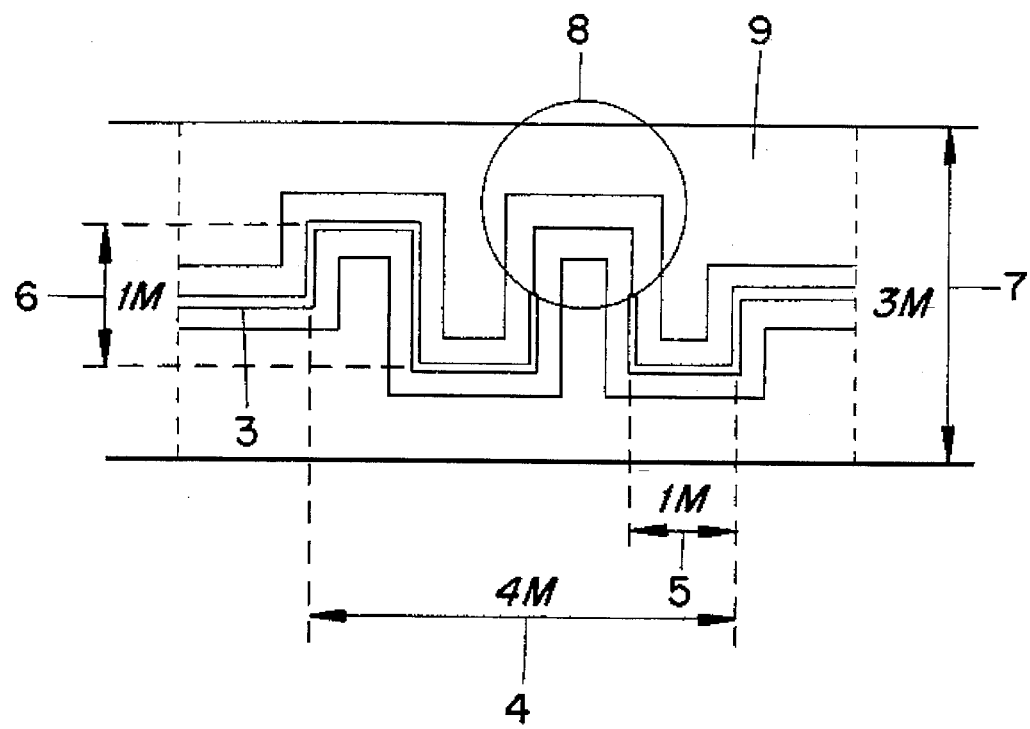
Fig. 2B 5,543,774

METHOD AND A DEVICE FOR PROTECTING A PRINTED CIRCUIT BOARD AGAINST OVERCURRENTS

BACKGROUND

The present invention relates to a method and a device for protecting a printed board against overcurrents by mounting thereon a printed board fuse which will interrupt the current in case of overcurrents.

From, for example, EP-A1 0 270 954 there is previously known a chip-type fuse which may be used mounted on and connected to a printed circuit board/printed board. Said chip-type fuse comprises an insulating member, such as an insulating substrate having a pair of metallic electrodes of thin-film type disposed thereon, between which a current sensitive conductor is connected. Should an overcurrent pass through the fuse, the conductor will melt and the current will be interrupted. In order to prevent, in case of the conductor melting because of an overcurrent, a generated metal vapour from being set free and spreading and also to prevent arc discharge, the conductor is coated with a protective silicone resin film. Despite the small size of the fuse, the insulating member/substrate permits high current intensities. For increased sensitivity, the chip-type fuse may optionally be provided with trimmed portions which would more easily melt in case of an overcurrent.

From FR-A 2 053 881 there is previously known a similar fuse for printed circuits/printed boards. It is made according to the technique for printed circuits or rather by means of a method for analogue circuits such as metal coating, electroplating or attachment of a metallic film. The fuse is characterized in that the conductive current sensitive circuit contains a plurality of spaced apart constricted areas adjacent extended conductive surfaces. In the case of a temperature rise in the constricted areas, the substrate will not be affected since the constricted areas are located adjacent the extended conductive surfaces, which are exposed to the air so that the heat may be dissipated.

SUMMARY

In order to reduce the costs of printed board assemblies, this invention provides for a printed circuit board fuse which functions with great reliability at very low manufacturing costs. By coating a large area of a printed board with metal, for example electrolytically, a well-defined thickness of a metal layer may be achieved in which a fuse of, for example, square-wave type has been separated. The well-defined thickness also allows a well-defined geometry of the printed board fuse to be achieved. A prerequisite for a well functioning fuse, which works in a similar way on boards with different layouts, is that the cross-sectional area and length of the printed board fuse and therefore its resistance are very accurately defined. This is achieved by the metal layer surrounding the fuse and in case of a temperature rise said surrounding metal layer will have a heat dissipating effect on the fuse, providing a substantially reduced risk of board fire.

DESCRIPTION OF THE DRAWINGS

FIG. 2A shows a printed board fuse with copper plane according to the invention, on an enlarged scale, and FIG. 2B shows a portion of the printed board fuse according to the invention, with indicated measures.

DETAILED DESCRIPTION

Figure 1:
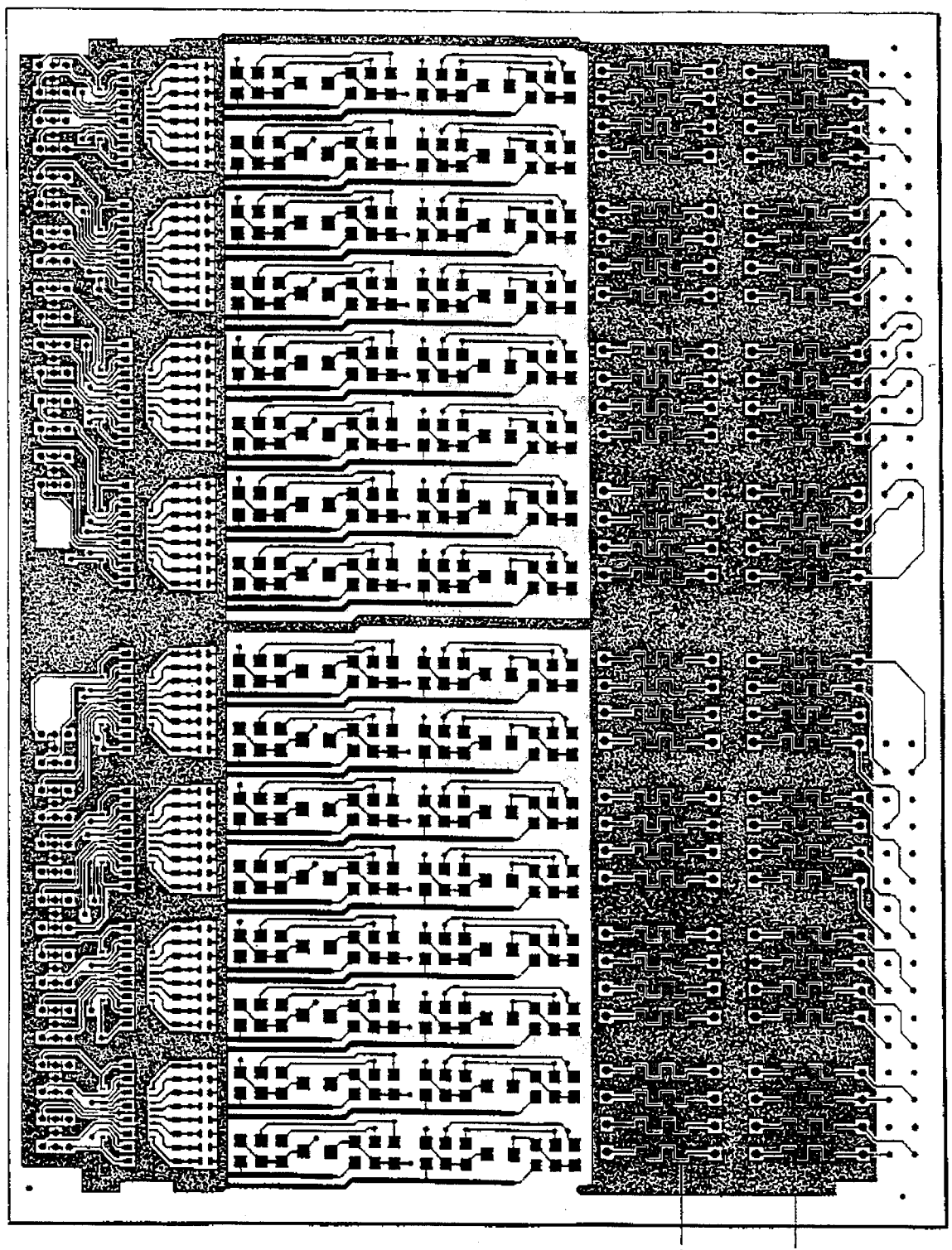
FIG. 1 shows a printed board having printed board fuses acceding to the invention.

For boards containing a large number of components, pattern plating is the most widely used manufacturing method. It is based on the principle of additively building up a pattern, in contrast to the tenting method in which a pattern is formed by etching. The pattern plating method has its limitations as regards thickness distribution. A variation is often due to the pattern distribution of the layout. Depending on the pattern distribution, the current from rectifiers in a plating bath will be distributed over the surface not protected by photoresist. Insulated conductors without surrounding copper will have a higher current density ($A/dm^2$) than a conductor located in an area with a large quantity of copper. The current density will determine the rate of precipitation of copper, and the time will determine the thickness. If there is no balanced shape, there may be great differences between different parts of a board. By applying the present plating method on the layout according to the invention there will be very small variations in the thickness of the copper plating and it is possible to achieve a very well defined thickness of individual elements.

By using, for instance, a plating method on a printed board, a fuse of copper may be provided as a conductor with very well defined shape and cross-sectional area, and a surrounding area with a uniform and well defined coated copper layer may be achieved. Since the fuse and the surrounding copper layer are made to cover a relatively large area with almost homogenous copper on the printed board, said method makes it possible to predetermine a certain thickness of the copper layer and therefore of the fuse, implying known interruption characteristics. The difference in thickness of one and the same conductor in a fuse with or without surrounding copper plane may amount to as much as 50% depending on the layout of the board, which would substantially alter the interruption characteristics.

FIG. 1 shows a plurality of printed board fuses disposed in a row along one longitudinal side of a printed board 2. FIGS. 2A and 2B show a possible configuration of a printed board fuse 1 on said board. Measurements for circuits of this kind are indicated as follows: 1 mil=0,0254 mm, and 1 M=2,54 mm. The individual conductor 3 of the fuse 1 is shaped like a square wave and could be described as a "snake". The length 4 of the fuse or "snake" could be 4M, where the length of each edge portion 5 is 1M and the distance 6 between the edges is 1M. The width 7 of a surrounding copper plane could be 3M. The width of the conductor 3 to and from the fuse is, for example, 8 mils, while the width of a shorter portion of the fuse, a section 8, is 6 mils in order to provide a defined interruption point for an overcurrent. The distance between the copper plane 9 and the conductor of the fuse could be 8 mils. The thickness of the fuse could be 40 μm, which is obtainable by said shape and method.

While only one shape of the fuse has been described, other shapes of the invention are feasible, in which a well-defined thickness of the conductor and a separate copper plane surrounding the conductor is achievable. The printed board is typically coated with a lacquer layer. In order for the fuse to have an increased heat dissipating capacity, the fuse may optionally be provided with an underlying insulated metallic plane of, for example, copper.

What is claimed is:

1. A method for manufacturing a printed board fuse to protect a printed board against overcurrents, comprising the step of depositing a heat dissipating metal layer having a substantially uniform thickness on a first area of the printed board and forming at least one fuse conductor in at least one second area of the printed board upon which the heat dissipating metal layer is not deposited, the fuse conductor and the heat dissipating metal layer each having a predetermined geometry and thickness selected to provide known resistance and interruption characteristics to the fuse conductor, and the first area substantially surrounding the at least one second area.

2. The method of claim 1, wherein the heat dissipating metal layer is copper and the layer is deposited by plating.

3. A printed board fuse for protecting a primed board against overcurrents, comprising at least one fuse conductor having a predetermined geometry and thickness selected to provide known resistance and interruption characteristics to the fuse conductor, wherein the at least one fuse conductor is formed by depositing a heat dissipating metal layer of a substantially uniform thickness on the printed board in a first area of the printed board substantially surrounding at least one second area of the printed board upon which the heat dissipating metal layer is not deposited, and forming the at least one fuse conductor on the at least one second area.

4. The printed board fuse of claim 3, wherein the fuse conductor is plated copper.

5. The printed board fuse of claim 3, wherein the fuse conductor has a square-wave shape and a section of reduced width.

* * * * *